(12) United States Patent
Buvid et al.

(10) Patent No.: US 9,287,190 B2
(45) Date of Patent: Mar. 15, 2016

(54) DEVICES EMPLOYING SEMICONDUCTOR DIE HAVING HYDROPHOBIC COATINGS, AND RELATED COOLING METHODS

(71) Applicant: International Business Machines Corporation, Armonk, NY (US)

(72) Inventors: Daniel J. Buvid, Rochester, MN (US); Eric J. Campbell, Rochester, MN (US); Tyler Jandt, Rochester, MN (US); Joseph Kuczynski, North Port, FL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/337,977

(22) Filed: Jul. 22, 2014

(65) Prior Publication Data

US 2016/0020160 A1    Jan. 21, 2016

Related U.S. Application Data

(63) Continuation of application No. 14/332,690, filed on Jul. 16, 2014.

(51) Int. Cl.
| | | |
|---|---|---|
| *H01L 23/36* | (2006.01) | |
| *H01L 23/29* | (2006.01) | |
| *H01L 23/31* | (2006.01) | |
| *H01L 23/367* | (2006.01) | |

(52) U.S. Cl.
CPC ............ *H01L 23/3107* (2013.01); *H01L 23/29* (2013.01); *H01L 23/315* (2013.01); *H01L 23/367* (2013.01); *H01L 23/3114* (2013.01); *H01L 23/3121* (2013.01)

(58) Field of Classification Search
None
See application file for complete search history.

(56) References Cited

U.S. PATENT DOCUMENTS

| | | | |
|---|---|---|---|
| 5,888,850 A * | 3/1999 | Havens et al. | 438/127 |
| 6,129,145 A | 10/2000 | Yamamoto et al. | |
| 6,351,030 B2 * | 2/2002 | Havens et al. | 257/690 |
| 6,358,780 B1 * | 3/2002 | Smith et al. | 438/127 |
| 7,151,009 B2 | 12/2006 | Kim et al. | |

(Continued)

FOREIGN PATENT DOCUMENTS

WO    2012167017 A2    12/2012

OTHER PUBLICATIONS

Dupont Teflon AF Product Information downloaded from URL <http://www2.dupont.com/Teflon_Industrial/en_US/assets/downloads/h44587.pdf> on Jun. 27, 2015.*

(Continued)

*Primary Examiner* — Joseph Schoenholtz
(74) *Attorney, Agent, or Firm* — Patterson & Sheridan, LLP

(57) ABSTRACT

Devices employing semiconductor die having hydrophobic coatings, and related cooling methods are disclosed. A device may include at least one semiconductor die electrically coupled to a substrate by electrical contact elements. During operation the semiconductor die and the electrical contact elements generate heat. By applying hydrophobic coatings to the semiconductor die and the electrical contact elements, a cooling fluid may be used to directly cool the semiconductor die and the electrical contact elements to maintain these components within temperature limits and free from electrical shorting and corrosion. In this manner, the semiconductor die and associated electrical contact elements may be cooled to avoid the creation of damaging localized hot spots and temperature-sensitive semiconductor performance issues.

20 Claims, 10 Drawing Sheets

(56) References Cited

U.S. PATENT DOCUMENTS

| | | | |
|---|---|---|---|
| 7,204,298 B2 | 4/2007 | Hodes et al. | |
| 7,372,148 B2 | 5/2008 | Im et al. | |
| 7,545,644 B2 | 6/2009 | Fedorov | |
| 7,608,924 B2 | 10/2009 | Myers et al. | |
| 8,415,704 B2 | 4/2013 | Ivanov et al. | |
| 8,488,321 B2 | 7/2013 | Brandenburg et al. | |
| 8,587,945 B1 | 11/2013 | Hartmann et al. | |
| 2008/0179760 A1* | 7/2008 | Mahler et al. | 257/788 |
| 2009/0065916 A1* | 3/2009 | Crane et al. | 257/676 |
| 2012/0063090 A1* | 3/2012 | Hsiao et al. | 361/699 |
| 2013/0309809 A1* | 11/2013 | Eckhardt et al. | 438/107 |
| 2014/0217622 A1* | 8/2014 | Kawate et al. | 257/791 |

OTHER PUBLICATIONS

Simpson, Dr. John T. et al, Superhydrophobic Materials, Oak Ridge National Laboratory, May 12, 2011, Oak Ridge, United States.

Knickerbocker, J.U. et al, System-on-Package (SOP) Technology, Characterization and Applications, Electronic Components and Technology Conference, 2006, pp. 415-421, IEEE, Piscataway, United States.

U.S. Appl. No. 14/332,690, entitled Devices Employing Semiconductor Die Having Hydrophobic Coatings, and Related Cooling Methods, filed Jul. 16, 2014.

Thierry Materne et al., Organosilane Technology in Coating Applications: Review and Perspectives, p. 2-16, Dow Corning, 2006, USA.

Barry Arkles, Hydrophobicity, Hydrophilicity and Silanes, Paint & Coatings Industry magazine, Oct. 2006, p. 114-132, Che Mtech, USA.

Thierry Materne et al. Organosilane Technology in Coating Applications: Review and Perspectives, p. 2-16, Dow Corning, 2006, USA.

Diversified Enterprises "Surface Energy Data for Epoxies and Epoxy Resins", downloaded from URL <http://www.accudynetest.com/polymer_surface_data/epoxy.pdf> on Apr. 16, 2009.

* cited by examiner

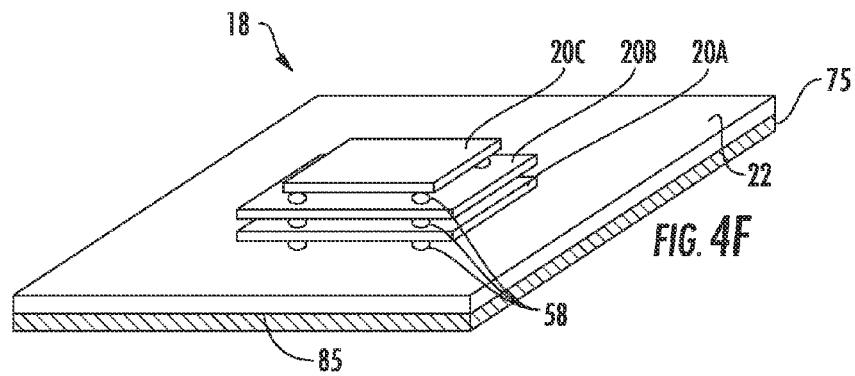
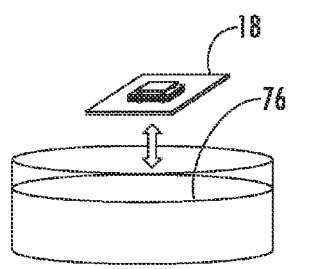
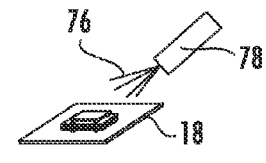
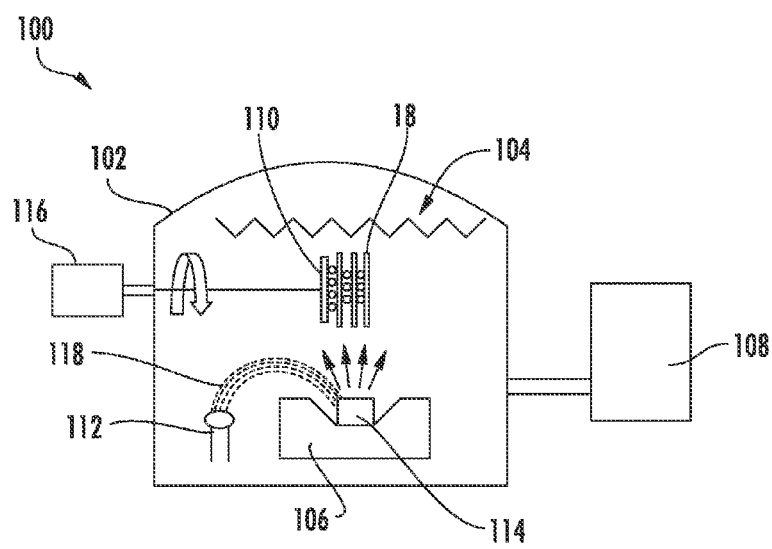

US 9,287,190 B2

DEVICES EMPLOYING SEMICONDUCTOR DIE HAVING HYDROPHOBIC COATINGS, AND RELATED COOLING METHODS

CROSS-REFERENCE TO RELATED APPLICATIONS

This application is a continuation of co-pending U.S. patent application Ser. No. 14/332,690, filed Jul. 16, 2014. The aforementioned related patent application is herein incorporated by reference in its entirety.

BACKGROUND

The present invention relates to thermal management devices, and more specifically, to methods and devices to provide cooling for electronic systems.

Electronic devices perform tasks which are becoming more complicated and computationally intensive with each passing year. In response to the requirements placed on these electronic devices, semiconductor die need to perform at ever-increasing levels of performance. In order to provide the increasing performance, successive generations of electronic devices include semiconductor die having smaller design rules which enable higher data speeds with the tradeoff of generating more heat in successively smaller spatial volumes. Further, as semiconductor die become smaller, packaging and interconnection circuitry coupling the semiconductor die to the larger electrical device becomes more densely packed. This dense interconnection circuitry may become a physical obstacle to remove heat from the semiconductor die and contributes to the heat generated by the electrical device. Heat is often removed from the electrical device as materials making up the electrical device may be altered by temperatures above a certain threshold and these temperatures may adversely change electrical characteristics of the materials. For example, power leakage through transistors on logic circuitry may occur as the temperature is increased and data integrity issues may occur when memory cells are exposed to temperatures outside their operating range. Also, removing heat may reduce extreme temperature fluctuations in the electrical device which can damage components through expansion and contraction when power is cycled on and off.

Conventional cooling approaches for semiconductor die include passive air convection, forced air conduction, and/or thermal sinks. However, these approaches are becoming less effective given the greater amounts of heat being generated in reduced spatial volumes. New cooling approaches for electronic devices are needed.

SUMMARY

According to one embodiment, a method is disclosed. The method includes conductively coupling a first semiconductor die to a substrate with at least one electrical contact element. The method also includes applying a hydrophobic coating directly to the semiconductor die, substrate, and electrical contact element. The hydrophobic coating is selected to transfer heat from the semiconductor die to a cooling fluid. In this manner, the semiconductor die may be efficiently cooled.

In another embodiment, a method is disclosed. The method includes applying power to at least one semiconductor die through at least one electrical contact element. The method also includes flowing a cooling fluid into contact with a hydrophobic coating attached to an exterior of the at least one semiconductor die and at least one electrical contact element. In this manner, local hot spots on the at least one semiconductor die may be prevented as efficient cooling is provided.

In another embodiment, a method is disclosed. The method includes applying power to a plurality of semiconductor die and the at least one electrical contact and the at least one electrical contact element through a second level interconnect of a substrate. The plurality of semiconductor die is in a stacked arrangement to form a 3D chip stack. The method also includes directing a cooling fluid through an inlet port of an enclosure and into a chamber, wherein the chamber is formed by the enclosure. The plurality of semiconductor die is disposed within the chamber, and the enclosure is attached to the substrate. The method also includes flowing the cooling fluid into contact with a hydrophobic coating attached to an exterior of the plurality of semiconductor die. The method also includes flowing the cooling fluid out of the chamber through an outlet port of the enclosure. The hydrophobic coating comprises at least one of: phased-separated spinodal glass powder, ceramic particles, diatomaceous earth, organosilanes, fluorinated organic compounds, silicones, siloxanes, and sol-gel materials including metal oxides. In this manner, temperature swings may be minimized when the 3D chip stack is cyclically turned on and off to reduce a probability of cracks forming in the 3D chip stack associated with cyclical expansion and contraction.

In another embodiment, an electrical assembly is disclosed. The electrical assembly comprises at least one semiconductor die. The electrical assembly also comprises a substrate configured to interface with an electrical source. The electrical assembly also comprises at least one electrical contact element conductively connecting the at least one semiconductor die to a substrate. The electrical assembly also comprises a hydrophobic coating attached to the at least one semiconductor die, substrate, and at least one electrical contact element. In this manner, the semiconductor die may be configured to be efficiently cooled by direct cooling.

In another embodiment, an electrical assembly is disclosed. The electrical assembly includes at least one semiconductor die generating heat. The electrical assembly also includes at least one substrate electrically coupled to an electrical source. The electrical assembly also includes at least one electrical contact element conductively connecting the substrate and the at least one semiconductor die. The electrical assembly also includes a hydrophobic coating disposed on the at least one semiconductor die, at least one substrate, and at least one electrical contact element. The hydrophobic coating includes an inner surface in direct thermal conductive communication with the semiconductor die and an outer surface configured for direct convective heat transfer to a cooling fluid. In this manner, hot spots on the at least one semiconductor die may be prevented as efficient cooling is provided.

In another embodiment, an electrical assembly is disclosed. The electrical assembly includes a substrate configured to interface with an electrical source. The electrical assembly also includes a plurality of semiconductor die. The plurality of semiconductor die including a first semiconductor die and a second semiconductor die. The substrate and the plurality of semiconductor die are in a stacked arrangement to form a 3D chip stack, and the first semiconductor die is disposed between the second semiconductor die and the substrate. The electrical assembly also includes at least one electrical contact element conductively connecting the first semiconductor die to the substrate and the second semiconductor die to at least one TSV (through silicon via) of the first semiconductor die. The electrical assembly also includes a hydrophobic coating attached to each of the plurality of semiconductor die, substrate, and electrical contact element. The electrical assembly also includes an enclosure secured to the substrate and forming a chamber containing the plurality of semiconductor die. The enclosure includes an inlet port and an outlet port configured for a cooling fluid to respectively enter and depart from the chamber. The hydrophobic coating includes an inner surface in direct conductive thermal communication with the semiconductor die and an outer surface arranged for direct convective thermal communication with the cooling fluid. In this manner, temperature swings may be minimized when the 3D chip stack may be cyclically turned on and off to reduce a probability of cracks forming in the electrical assembly associated with cyclical expansion and contraction.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE SEVERAL VIEWS OF THE DRAWINGS

FIG. 4F is a top perspective view of the electrical assembly of FIG. 4E created by the conductive connecting of FIGS. 4B through 4E with a masking layer applied to the substrate;

FIG. 4G-1 is a top perspective view of the electrical assembly of FIG. 4F being immersed into a hydrophobic coating solution to apply the hydrophobic coating;

FIG. 4G-2 is a top perspective view of the electrical assembly of FIG. 4F with the hydrophobic coating solution being sprayed thereon with an exemplary spray nozzle as an alternative to FIG. 4G-1;

FIG. 4G-3 is a schematic view of the electrical assembly of FIG. 4F with a hydrophobic coating being applied by an evaporation deposition process as an alternative to FIG. 4G-1;

FIG. 4G-4 is a schematic view of the electrical assembly of FIG. 4F with a hydrophobic coating being applied by a chemical vapor deposition process as an alternative to FIG. 4G-1;

DETAILED DESCRIPTION

Figure 1A:
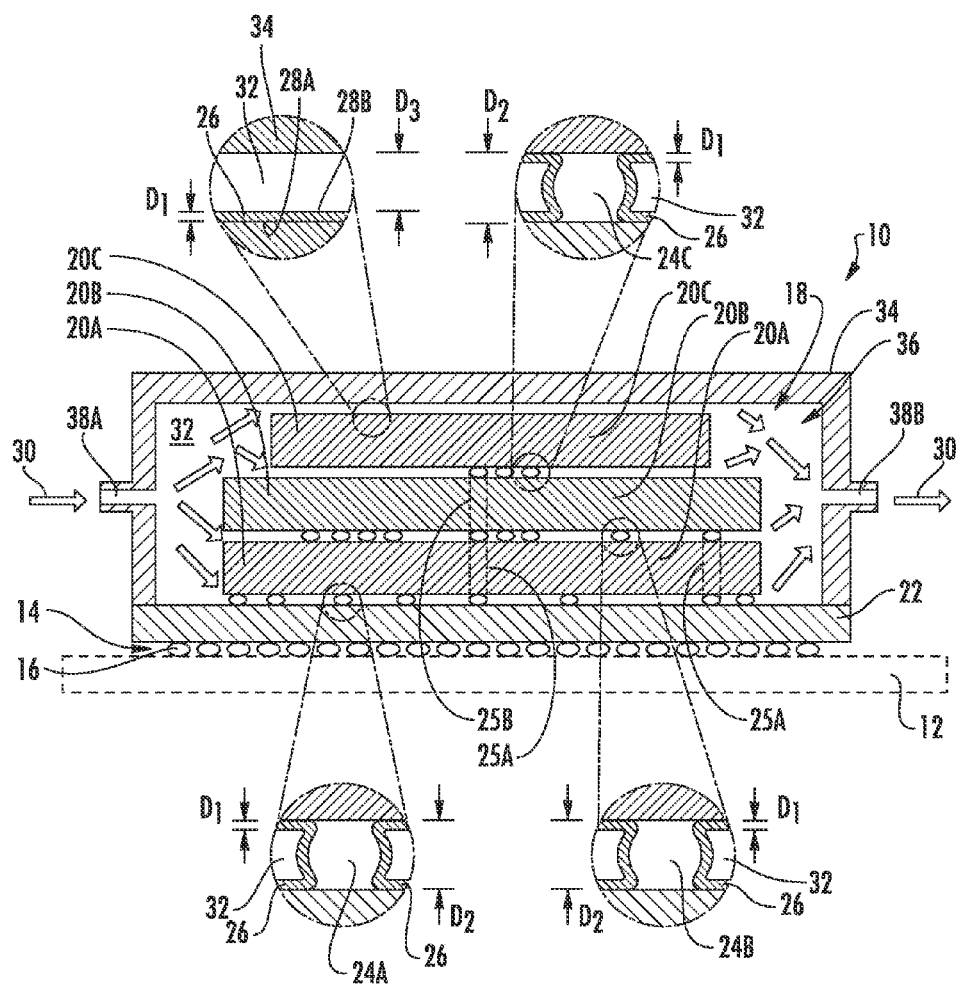
FIGS. 1A and 1B are a partial cutaway front side view and a partial cutaway right side view, respectively, of an exemplary electrical device including at least one semiconductor die electrically connected to a substrate using electrical contact elements and cooled by a cooling fluid as directed by an enclosure, wherein a hydrophobic coating is applied to the at least one semiconductor die, at least one electrical contact element, and substrate.
Figure 1B:
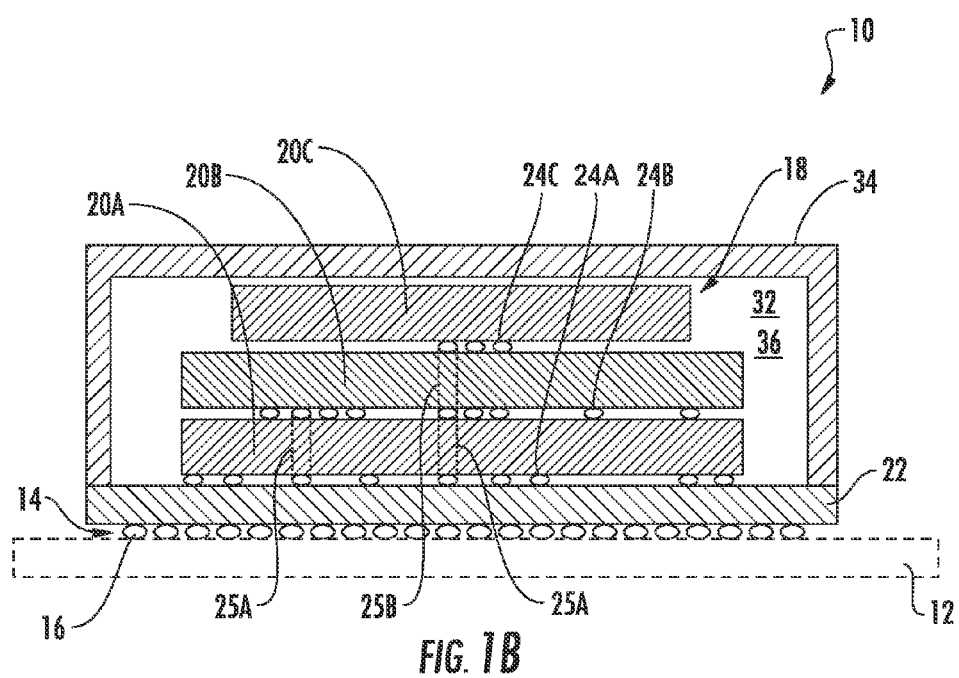

FIGS. 1A and 1B are a partial cutaway front side view and a partial cutaway right side view, respectively, of an exemplary electrical device 10. The electrical device 10 may be optionally electrically connected to a circuit board 12 through a second layer interconnect 14. The electrical device 10 may perform arithmetic, logic, and/or memory operations according to information exchanged through the second layer interconnect 14. In the embodiment depicted in FIG. 1A, the second layer interconnect 14 is shown as a plurality of solder balls 16 in a ball grid array configuration, but in other embodiments the second layer interconnect 14 could include, for example, a plurality of pins in a pin grid array, a plurality of wire bonds connecting a substrate 22 to the circuit board 12, and/or a plurality of pads in a land grid array (LGA) configuration. The electrical device 10 may also receive electrical power through the second layer interconnect 14. In this manner, the electrical device 10 may receive power and exchange data.

The electrical device 10 includes an electrical assembly 18 which performs information processing for the electrical device 10. The electrical assembly 18 comprises at least one semiconductor die 20A-20C; a substrate 22; at least one electrical contact element 24A-24C; and hydrophobic coating 26. The semiconductor die 20A-20C are electrically connected to the substrate 22 by the electrical contact elements 24A-24C. Specifically, the second semiconductor die 20B may be electrically connected by the electrical contact elements 24A, 24B and at least one TSV 25A ("through silicon via") to the substrate 22. The third semiconductor die 20C may be electrically connected by the electrical contact elements 24A-24C and at least one TSV 25A, 25B to the substrate 22. The substrate 22 receives electrical power from the circuit board 12 via the second layer interconnect 14 as discussed above. In this manner, the semiconductor die 20A-20C receive electrical power to perform arithmetic, logic, and/or memory operations for the electrical device 10. The semiconductor die 20A-20C, the electrical contact elements 24A-24C, and the substrate 22 contain conductive materials having electrical resistance and generate heat when carrying electrical current associated with the electrical power.

The heat generated by the electrical assembly 18 is transferred by thermal conduction to the hydrophobic coating 26. The hydrophobic coating 26 includes an inner surface 28A attached to exterior surfaces of the semiconductor die 20A-20C, the electrical contact elements 24A-24C, and the substrate 22. The hydrophobic coating 26 may also include an outside surface 28B configured to transfer the heat through convective heat transfer from the hydrophobic coating 26 to a cooling fluid 30 in an ambient environment 32. In this manner, the heat may be efficiently removed from the electrical assembly 18.

Figure 1C:
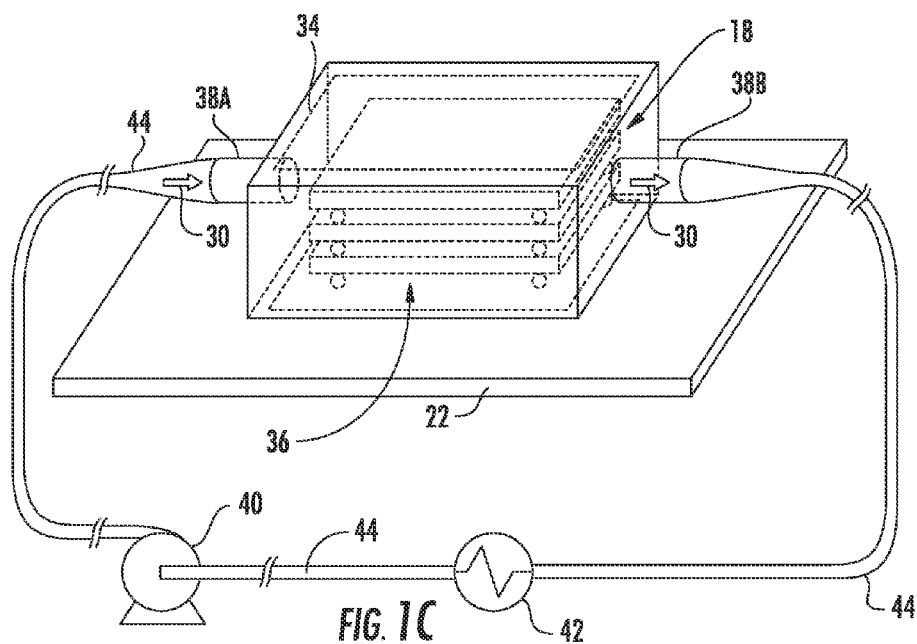
FIG. 1C is a top perspective view of the electrical device of FIG. 1A being cooled by the cooling fluid which is in communication with an exemplary pump and an exemplary heat exchanger.

FIG. 1C is a top perspective view of heat being removed from the electrical device 10 of FIG. 1A by the cooling fluid 30. The electrical device 10 may also include an enclosure 34 which directs the cooling fluid 30 to and from the electrical assembly 18. The enclosure 34 may be secured to the substrate 22 and may form a chamber 36 to contain the at least one semiconductor die 20A-20C and the electrical contact elements 24A-24C. The cooling fluid 30 may enter the chamber 36 through at least one inlet port 38A of the enclosure 34 and may exit the chamber 36 through at least one outlet port 38B. The cooling fluid 30 may be in communication with an exemplary pump 40 to ensure a sufficient flow rate of the cooling fluid 30 through the chamber 36 to maintain the electrical assembly 18 within a temperature range. The cooling fluid 30 may also be in communication with an exemplary heat exchanger 42. The heat exchanger 42 may remove at least a portion of the heat from the cooling fluid 30 to enable the cooling fluid 30 to return to the chamber 36 at a determined temperature to control the temperature of the electrical assembly 18. The cooling fluid 30 may be directed from the outlet port 38B to the pump 40 and the heat exchanger 42, and then to return to the inlet port 38A with a fluid conduit 44, for example, plastic tubing. By changing the flow rate of the cooling fluid 30 with the pump 40 and/or the temperature of the cooling fluid 30 departing the heat exchanger 42, the temperature of the electrical assembly 18 may be maintained below a threshold temperature. In this manner, the temperature-sensitive characteristics of the semiconductor die 20A-20C may be controlled to enable predictable performance of the electrical assembly 18.

Figure 1D:
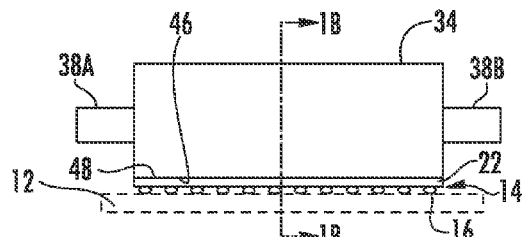
FIGS. 1D and 1E are a front side view and left side view of the electrical device of FIG. 1A including the enclosure.
Figure 1E:
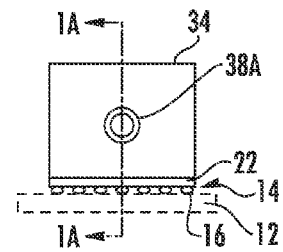
Figure 1F:
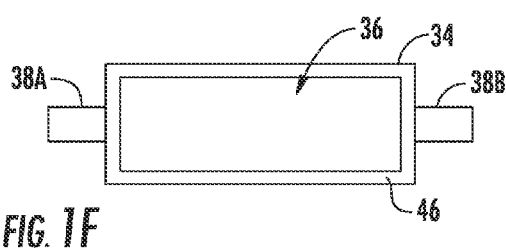
FIG. 1F is a bottom view of the enclosure of the electrical device of FIG. 1D.

FIGS. 1D and 1E are a front side view and left side view of the electrical device 10 of FIG. 1A depicting the enclosure 34, secured to the substrate 22. FIG. 1F is a bottom view of the enclosure 34 of the electrical device 10 of FIG. 1D depicting an interface surface 46 which may be complementary to a mounting surface 48 of the substrate 22 to form a tight seal to restrict entry into and exit from the chamber 36, except through the inlet port 38A and the outlet port 38B. The tight seal may include bonding material, for example, epoxy to secure the enclosure 34 to the substrate 22 or mechanical sealing means. In this manner, the enclosure 34 may be secured to the substrate 22.

Figure 1G:
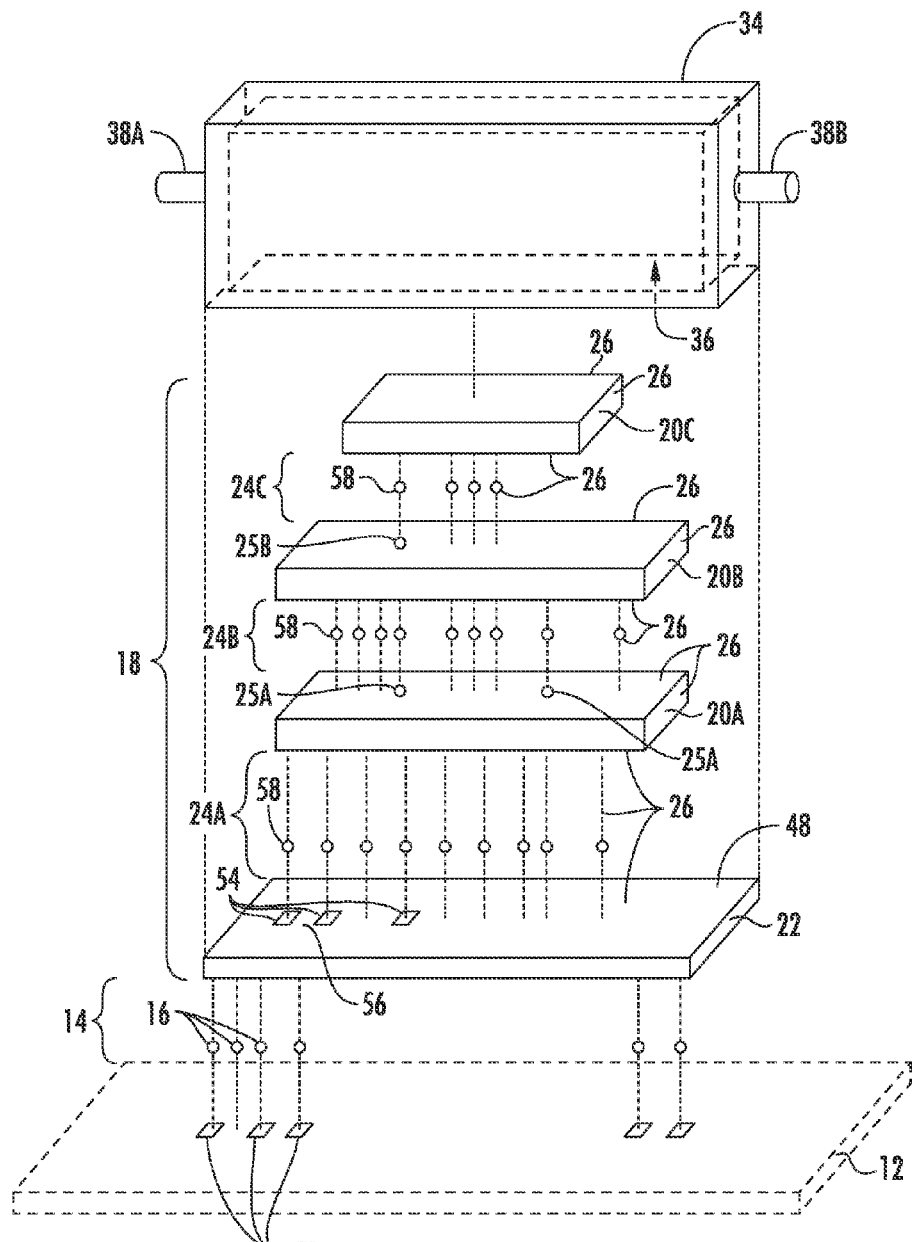
FIG. 1G is an exploded top perspective view of the electrical device of FIG. 1D.

Now that an introduction of the electrical device 10 has been provided, details of the associated components are provided in more detail in relation to FIG. 1G, which is an exploded top perspective view of the electrical device 10. The electrical device 10 includes the second layer interconnect 14, the substrate 22, the electrical contact elements 24A-24C, the at least one semiconductor die 20A-20C, the hydrophobic coating 26, and the enclosure 34. These are now discussed in sequence.

The second layer interconnect 14 connects the electrical device 10 to the circuit board 12. The second layer interconnect 14 may be, in one example depicted in FIG. 1G, a ball grid array (PGA) comprising a plurality of solder balls to attach the electrical device 10 to pads 50 on the circuit board 12. In other examples the second layer interconnect 14 may be in a pin grid array (PGA) utilizing metal pins to be inserted into holes in a socket that may be soldered to the circuit board 12. In another example, the second layer interconnect 14 may be pads instead of the solder balls in which the pads are abutted against spring contacts in a socket secured to the circuit board 12. In another example, the second layer interconnect 14 may be wire bonds instead of solder balls in which wires bonded to pads on the substrate 22, and the circuit board 12. The second layer interconnect 14 is made of a strong conductive material which may comprise, for example, copper, tin, gold, and/or aluminum. In this manner, the electrical assembly 18 can be attached to the circuit board 12.

It is noted that the second layer interconnect 14 may be free of the hydrophobic coating 26, except in embodiments when the circuit board 12 is to be in contact with the cooling fluid 30. In some embodiments where the circuit board 12 is to be in contact, then the hydrophobic coating 26 may also be applied to the second layer interconnect 14.

With continued reference to FIG. 1G, the substrate 22 may serve as a structural foundation upon which the electrical device 10 is constructed and also may provide an electrical interface to a circuit board 12 through the second layer interconnect 14. As a structural foundation, the substrate 22 may secure the at least one semiconductor die 20A-20C to the circuit board 12 through the second layer interconnect 14 and the electrical contact elements 24A-24C. The substrate 22 also provides an electrical interface between the second layer interconnect 14 and the electrical contact elements 24A-24C which may be electrically connected to the at least one semiconductor die 20A-20C. The substrate 22 may provide electrical pathways 54 separated and supported with dielectric material 56 to minimize crosstalk, electrical shorting, and power leakage. To provide the electrical pathways 54, the substrate 22 may contain conductive material which may comprise, for example, copper, tin, gold, and/or aluminum. To provide the structural foundation and dielectric characteristics, the substrate 22 may also comprise, for example, thermoplastic, thermosets, ceramic, and/or composite material. In this manner, the substrate 22 may serve as a structural foundation and electrical interface.

It is noted that the substrate 22 may contact the cooling fluid 30 at the mounting surface 48 of the substrate 22. In order to protect the electrical contact element 24A from the cooling fluid 30, the hydrophobic coating 26 may be applied to the mounting surface 48, for example, in order to prevent electrical crosstalk, electrical shorts and power loss. In this manner, the hydrophobic coating 26 may form a uniform layer preventing the cooling fluid 30 from contacting the electrical contact elements 24A. The hydrophobic coating 26 may also seal the mounting surface 48 to prevent the cooling fluid 30 from entering into surface irregularities in the substrate 22, which may cause small surface cracks to propagate and cause leaks.

The electrical contact elements 24A-24C conductively connect the at least one semiconductor die 20A-20C to the substrate 22. The electrical contact elements 24A-24C may comprise, in one example depicted in FIG. 1G, solder balls 58 which may conductively connect to electrical contacts (not shown) and through silicon vias (TSVs) of the semiconductor dies 20A-20C. In another example, The electrical contact elements 24A-24C may comprise wire bonds, in which wires bonded to electrical contacts on semiconductor die 20A-20C are bonded to other semiconductor die 20A-20C and/or the substrate 22. The electrical contact elements 24A-24C may comprise a strong conductive material, for example, copper, gold, silver, tin, and/or aluminum. The outside surface of the electrical contact elements 24A-24C may have the hydrophobic coating 26 applied to prevent contact with the cooling fluid 30. The cooling fluid 30 may cause electrical shorting, cross talk or power loss if not prevented by the hydrophobic coating 26 from contacting the electrical contact elements 24A-24C. In this manner, the electrical contact elements 24A-24C may conductively connect the at least one semiconductor die 20A-20C to the substrate 22 while being protected from contact with the cooling fluid 30.

The semiconductor die 20A-20C may perform the arithmetic, logic, and/or memory operations of the electrical device 10. The semiconductor die 20A-20C may comprise, for example, one or more of: a computer processor, an application-specific integrated circuit (ASICS), and/or a dynamic random access memory (DRAM). The at least one semiconductor die 20A-20C may be manufactured, for example, using microlithography techniques on a silicon wafer. The semiconductor die 20A-20C may be cut from one or more wafers and may comprise electrical components to perform arithmetic, logic, and/or memory operations. The semiconductor die 20A, 20B may respectively contain TSVs 25A, 25B to electrically connect the semiconductor die 20A-20C in a 3D chip stack arrangement. In this manner, a footprint of the electrical device 10 on the printed circuit board 12 may be minimized and connection distances between the semiconductor die 20A-20C minimized to increase processing speed.

Further, the hydrophobic coating 26 may be attached to the external surface of the at least one semiconductor die 20A-20C. The hydrophobic coating 26 may prevent the cooling fluid 30 from contacting electrical connection locations between the electrical contact elements 24A-24C and the at least one semiconductor die 20A-20C. The hydrophobic coating 26 may also prevent the cooling fluid 30 from penetrating into the semiconductor die 20A-20C where materials could be vulnerable to corrosion, electrical cross talk, power loss, and electrical shorting. In this manner, the at least one semiconductor die 20A-20C may be protected from the cooling fluid 30.

The enclosure 34 directs the cooling fluid 30 to and from the electrical assembly 18. The enclosure 34 may be made from a strong material resistant to leakage of the cooling fluid 30, may include a chemical composition inert to the cooling fluid 30, and may include a melting point higher than operating temperatures of the electrical device 10. In this regard, the enclosure 34 may comprise, for example, plastic and/or metal. The enclosure 34 may form the chamber 36 within which the at least one semiconductor dies 20A-20C and the electrical contact elements 24A-24C may be disposed. The enclosure 34 may include the at least one inlet port 38A for the cooling fluid 30 to enter the chamber 36 and remove the heat from the electrical assembly 18 through convective heat transfer. The enclosure may also include the at least one outlet port 38B for the cooling fluid 30 containing the heat from the electrical assembly 18 to depart from the chamber 36. The enclosure 34 may be secured to the substrate 22 to prevent the cooling fluid 30 from entering and departing the chamber 36 without use of the inlet port 38A and the outlet port 38B. In this manner, the heat may be removed from the electrical assembly 18.

It is noted that the cooling fluid 30 may be a liquid or a gas. Preferably the cooling fluid 30 is a liquid possessing a relatively low viscosity to efficiently move through the chamber 36, high thermal conductivity, high specific heat, and thermal stability at operating temperatures. The hydrophobic coating 26 may prevent contact between the cooling fluid 30 and electrical components of the electrical assembly 18 to enable the cooling fluid 30 to be electrically conductive. The cooling fluid 30 may comprise, for example, water, ethylene glycol, propylene glycol, perfluorinated hydrocarbons (e.g., Fluorinert™), synthetic hydrocarbons (e.g., polyalphaolefins), suspended nanoparticles, glycol, and/or any combination thereof. In this manner, the cooling fluid 30 may enter through the inlet port 38A, receive heat generated by the electrical assembly 18, and then exit the chamber 36 with the heat through the outlet port 38B.

With continued reference to FIG. 1G, and also reference back to FIG. 1A, the hydrophobic coating 26 may be attached to the at least one semiconductor die 20A-20C, the electrical contact elements 24A-24C, and the substrate 22 through a cohesive and/or adhesive bond. The hydrophobic coating 26 may comprise at least one of: phased-separated spinodal glass powder, ceramic particles, diatomaceous earth, organosilanes (RnSi(OR)4-n, wherein R is an alkyl, aryl, organofunctional group, fluorinated organic compound, and/or a methoxy, ethoxy, or acetoxy group), other fluorinated organic compounds, silicones, siloxanes, and sol-gel materials including metal oxides. The ceramic particles may, for example, include nanoparticles. The ceramic particles may also include at least one of, for example, aluminum oxide and zinc oxide. In some cases, the hydrophobic coating 26 may comprise at least one of: Nanomyte® coatings made by NEI Corporation of Somerset, N.J.; Ultra Ever Dry made by UltraTech International, Incorporated; Rust-Oleum® NeverWet® made by Rust-Oleum Corporation of Vernon Hills, Ill.; and Hydro-Foe™ superhydrophobic coating made by Lotus Leaf Coatings, Incorporated of Albuquerque, N. Mex. The hydrophobic coating 26 may include a wetting characteristic associated with an effective contact angle of at least ninety (90) degrees with a drop of water, and preferably more than one-hundred fifty (150) degrees. A thickness D1 (FIG. 1A) of the hydrophobic coating 26 may be in a range from two (2) angstroms to seventy-five (75) microns to minimize an obstruction to the cooling fluid 30 traveling through the enclosure 34. The hydrophobic coating 26 may prevent the cooling fluid 30 from contacting the at least one semiconductor die 20A-20C, the electrical contact elements 24A-24C, and the substrate 22. Also, in some embodiments utilizing a solution-based coating application, the hydrophobic coating 26 also may be relatively inexpensive to apply as opposed to more expensive embodiments utilizing, for example, a vapor deposition process and/or an evaporative deposition process. In this manner, the hydrophobic coating 26 may be used as part of the electrical device 10 to enable efficient cooling of the semiconductor die 20A-20C by the cooling fluid 30 while avoiding cross talk and electrical shorts related to contact of the cooling fluid 30 with the electrical contact elements 24A-24C.

The hydrophobic coating 26 may provide several benefits. First, the hydrophobic coating 26 may form a physical barrier to prevent the cooling fluid 30 from contacting the at least one semiconductor die 20A-20C, the electrical contact elements 24A-24C, and the substrate 22. Secondly, the hydrophobic coating 26 may increase the efficiency of heat transfer, for example, by conducting heat from the inner surface 28A to the outer surface 28B, to the cooling fluid 30. Thirdly, the hydrophobic coating 26 may be applied using various methods including a relatively low-cost, solution-based application instead of more expensive vapor deposition processes. In this manner, the hydrophobic coating 26 may provide efficient cooling to the semiconductor die 20A-20C.

Figure 2:
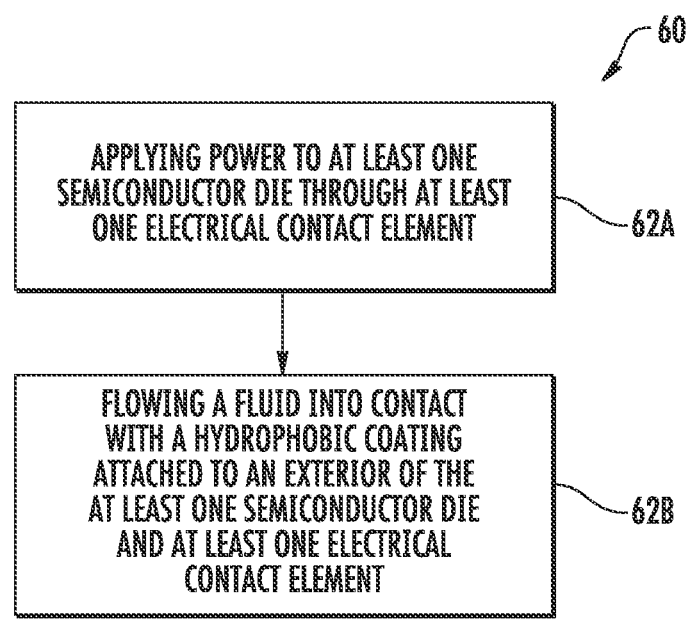
FIG. 2 is a flow chart of an exemplary method for cooling the electrical assembly of the electrical device of FIG. 1A.

Now that the components and embodiments of the electrical device 10 have been discussed, FIG. 2 depicts a flow chart of an exemplary method 60 for cooling the electrical assembly 18 of the electrical device 10 of FIG. 1C. The method 60 includes the operations 62A and 62B which are discussed below using the terminology discussed above.

In this regard, the method 60 may include applying power to the at least one semiconductor die 20A-20C through the electrical contact elements 24A-24C and the TSVs 25A, 25B (operation 62A of FIG. 2). The method 60 may also include flowing the cooling fluid 30 into contact with the hydrophobic coating 26 attached to an exterior of the at least one semiconductor die 20A-20C and the electrical contact elements 24A-24C (operation 62B of FIG. 2). In this manner, efficient cooling may be provided to the at least one semiconductor die 20A-20C.

Figure 3:
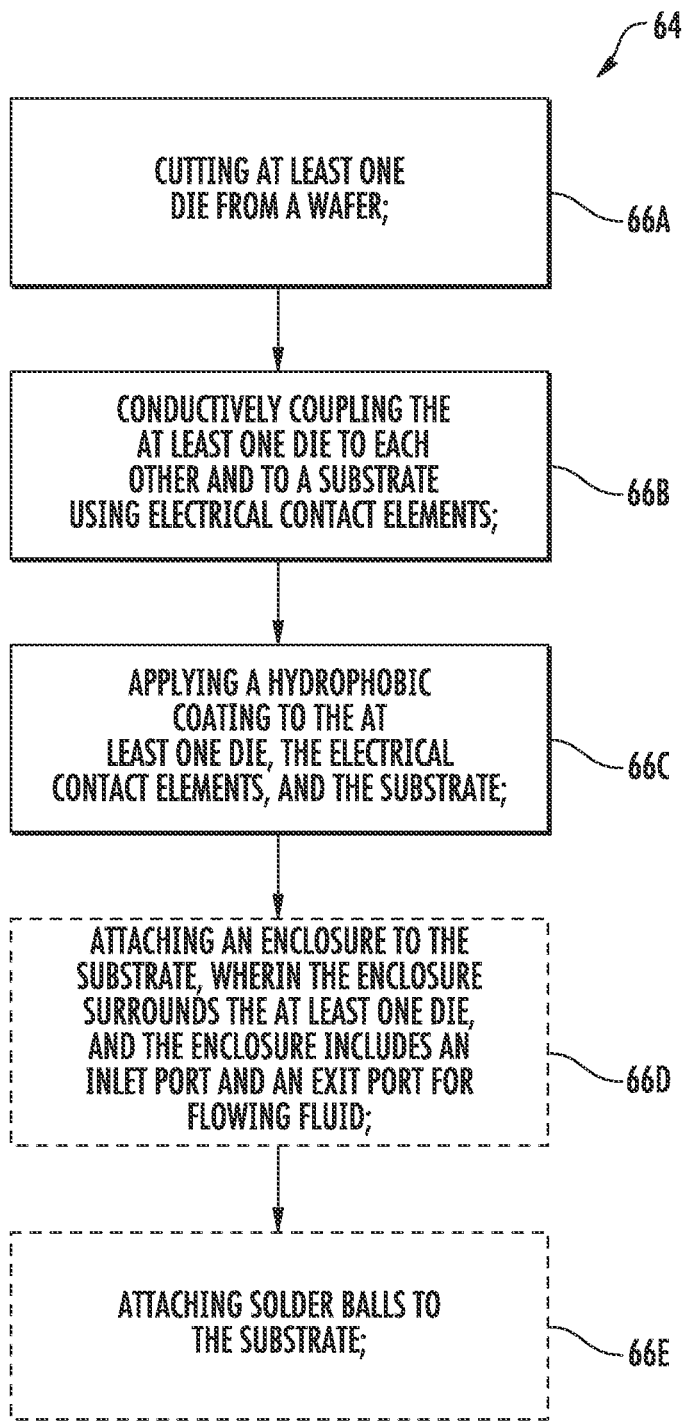
FIG. 3 is a flow chart of an exemplary method for creating the electrical device of FIG. 1A.

Next, FIG. 3 depicts a flow chart of an exemplary method 64 for creating the electrical device 10 of FIG. 1A. The method 64, including the operations 66A through 66E, is discussed in detail with respect to FIGS. 4A through 4K below using the terminology discussed above.

Figure 4A:
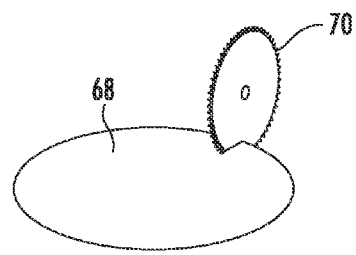
FIG. 4A is a top perspective view of an exemplary wafer being diced by a saw to create the at least one semiconductor die of FIG. 1A.

In this regard, FIG. 4A is a top perspective view of an exemplary wafer 68 being diced by a saw 70 to form the at least one semiconductor die 20A-20C of FIG. 1A (operation 66A of FIG. 3). The wafer 68 may be provided with the electrical interconnection features of the at least one semiconductor die 20A-20C, for example, by utilization of one or more microlithography processes. The saw 70 may be used to cut the wafer 68 into the semiconductor die 20A-20C which may be used as a part of the electrical device 10. It is noted that the semiconductor die 20A-20C may originate from different ones of the wafers 68 and may have different electrical features to perform different arithmetic, logic, and/or memory operations.

Figure 4B:
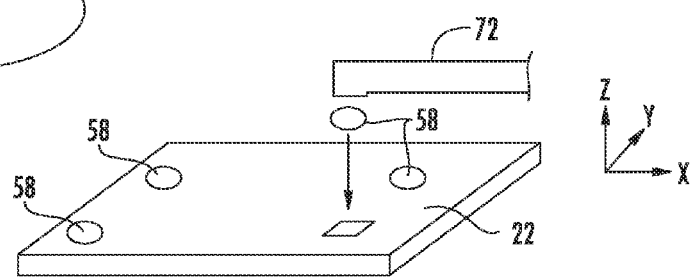
FIG. 4B is a top perspective view of the at least one electrical contact element being conductively connected to a substrate.

The method 64 may also include conductively coupling the at least one semiconductor die 20A-20C to each other and to the substrate 22 using the electrical contact elements 24A-24C (operation 66B in FIG. 3). In this regard, the electrical contact elements 24A-24C may comprise solder balls 58. FIG. 4B is a top perspective view of the electrical contact elements 24A-24C being conductively connected to the substrate 22. As shown in FIG. 4B the solder balls 58 may be precisely placed upon the substrate 22 using a ball placement system 72. In one example, the ball placement system 72 may comprise a Koses KAM 750 solder ball attach machine manufactured by Korea Semiconductor System, Company, Limited of Bucheon City, Kyunggi-Do, Korea.

Figure 4C:
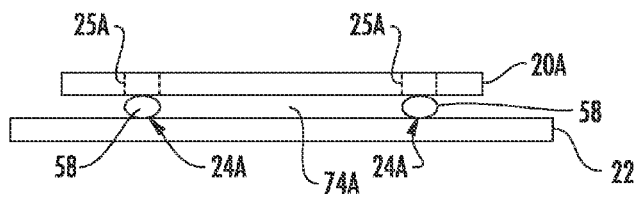
FIG. 4C is a side view of a first semiconductor die being conductively connected to the substrate through the at least one electrical contact element.

Once the solder balls 58 are attached to precise contact locations of the substrate 22, then the first semiconductor die 20A may be conductively connected to the substrate 22 through the at least one solder balls 58 of the at least one electrical contact elements 24A as shown in FIG. 4C using, for example, a robotic tool (not shown). The electrical contact elements 24C enable an interstitial space 74A to be disposed between the semiconductor dies 20B, 20C which may be later used for the cooling fluid 30 to flow and efficiently provide cooling to the semiconductor die 20B, 20C. It is noted that the solder balls 58 are connected to the at least one TSV 25A of the first semiconductor die 20A, so that at least a second semiconductor die 20B may be conductively connected to the substrate 22.

Figure 4D:
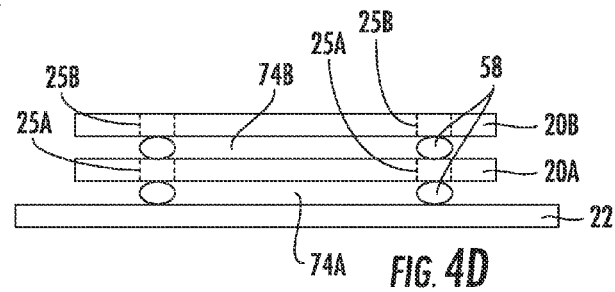
FIG. 4D is a side view of a second semiconductor die being conductively connected to the substrate by TSVs (through silicon vias) of the first semiconductor die and the at least one electrical contact element.
Figure 4E:
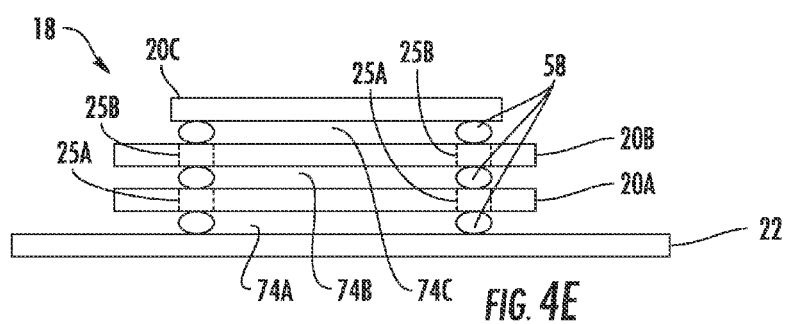
FIG. 4E is a side view of a third semiconductor die being conductively connected to the substrate by TSVs (through silicon vias) of the first and second semiconductor dies and the at least one electrical contact element to create an electrical assembly of the electrical device of FIG. 1A.

FIGS. 4D and 4E are side views of the second and third semiconductor dies 20B, 20C being conductively connected to the first semiconductor die 20A and the substrate 22 using the electrical contact elements 24A-24C and the TSVs 25A, 25C. This conductive coupling forms interstitial spaces 74B, 74C using similar manufacturing approaches discussed in relation to FIGS. 4B and 4C. The interstitial spaces 74A-74C may have a width $D_2$ (see FIG. 1A) in a range from one (1) micron to three (3) millimeters. In this manner, the electrical assembly 18 may be created.

As shown in FIG. 4F, a mask layer 75 may be applied to the second surface 85 of the substrate 22 in preparation for the hydrophobic coating 26 to be applied. The mask layer 75 may prevent, for example, the hydrophobic coating 26 from being attached to exterior areas of the substrate 22 where further electrical connections may be established. The mask layer 75 may be a conventional photoresist that may be removed in later stages of the method 64. Using photoresist enables specific areas of the mask to be exposed to a microlithography stepper (not shown) or pattern generator (not shown) to protect specific areas of the substrate 22. In the embodiment shown in FIG. 4F, the second surface 85 is fully masked to prevent later attachment with the hydrophobic coating 26. In this manner, the electrical assembly 18 may be readied for application of the hydrophobic coating 26.

Figures 4, 4G:
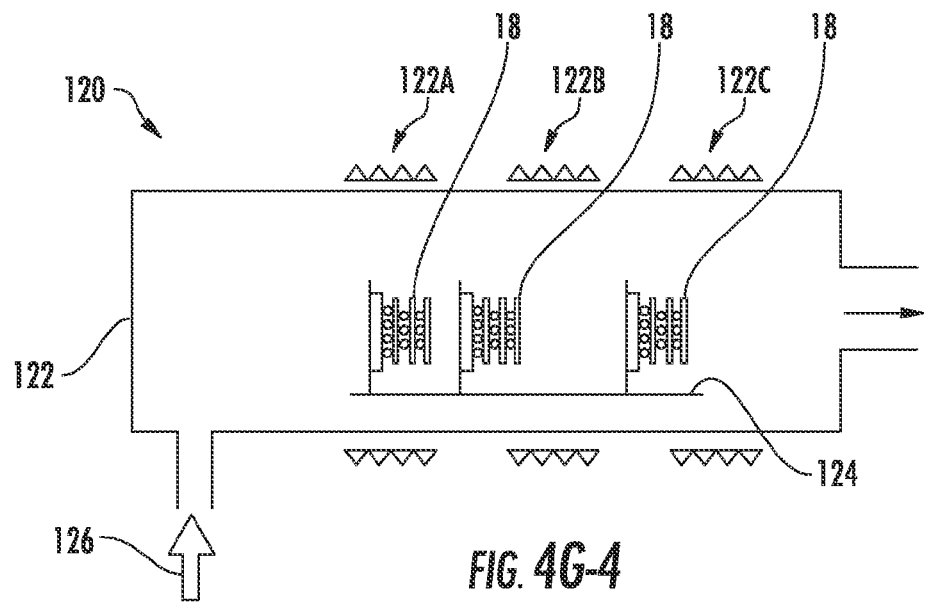

The method 64 also includes applying the hydrophobic coating 26 to the at least one semiconductor die 20A-20C; the at least one electrical contact element 24A-24C; and the substrate 22 (operation 66C of FIG. 3). In this regard, and in one exemplary approach, FIG. 4G-1 is a top perspective view of the electrical assembly 18 of FIG. 4F being immersed into a hydrophobic coating solution 76 which contains the hydrophobic coating 26. The electrical assembly 18 may be then spun about an axis of rotation $A_1$ (see FIG. 4H) to even out the hydrophobic coating solution 76 to a more uniform thickness. In another approach, as depicted in FIG. 4G-2, the hydrophobic coating solution 76 may be sprayed on to the electrical assembly 18 using at least one spray nozzle 78. The electrical assembly 18 may also be then spun relative to an axis of rotation $A_1$ (see FIG. 4H) to also even out the hydrophobic coating solution 76 to a more uniform thickness.

Figures 4H, 4I, 4J:
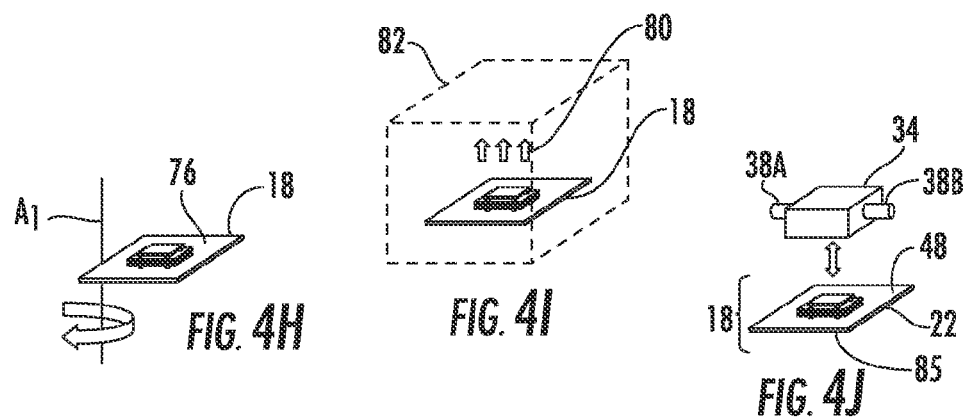
FIG. 4H is a top perspective view of the electrical assembly of FIG. 4F and the hydrophobic coating being rotated about an axis of rotation to create a more uniform thickness of the hydrophobic coating.
FIG. 4I is a top perspective view of the electrical assembly of FIG. 4F with the hydrophobic coating curing within an optional heating oven.
FIG. 4J is a top perspective view of an enclosure being attached to the substrate of the electrical assembly of FIG. 4I.

The hydrophobic coating solution 76 may be cured to form the hydrophobic coating 26. As shown in FIG. 4I the hydrophobic coating solution 76 may be cured by vaporizing solvents 80 within the hydrophobic coating solution 76 to leave a hydrophobic coating 26 applied to the semiconductor die 20A-20C; the electrical contact elements 24A-24C, and the substrate 22. An optional heating oven 82 (shown in broken lines in FIG. 4I) may be used to accelerate the curing process. Alternatively, in some cases, curing may be accomplished at room temperature without the heating oven 82. In this manner, a hydrophobic coating 26 may be applied.

In another approach for applying the hydrophobic coating 26, FIG. 4G-3 shows a schematic view of the electrical assembly 18 of FIG. 4F with the hydrophobic coating 26 being applied by an evaporation deposition device 100. The evaporation deposition device 100 includes a low-pressure chamber 102 comprising a heater 104, crucible 106, vacuum pump 108, fixture 110, electron source 112, and hydrophobic coating material 114. The electronic assembly 18 may be placed in the low-pressure chamber 102 which may be pulled to near vacuum with the vacuum pump 108. The electronic assembly 18 may be supported by the fixture 110 which may be moveable with an actuator 116. The electron source 112 may form an electron beam 118 which is received by the hydrophobic coating material 114 within the crucible 106. The hydrophobic coating material 114 may be evaporated and received by the electrical assembly 18 to form the hydrophobic coating 26. The heater 104 may facilitate a more uniform thickness of the hydrophobic coating material 114 by providing a more uniform temperature of the electrical assembly 18. In this manner, the hydrophobic coating 26 may be formed having a sub-nanometer thickness.

In another approach for applying the hydrophobic coating 26, FIG. 4G-4 shows a schematic view of the electrical assembly 18 of FIG. 4F with the hydrophobic coating 26 being applied by a chemical vapor deposition device 120. The chemical vapor deposition device 120 includes at least one resistance heater 122A-122C, a chamber 122, a fixture 124, and volatile precursors 126. The one or more electrical sub-assemblies 18 may be supported in the chamber 122 by the fixture 124 as they are exposed to the volatile precursors 126 comprising the hydrophobic coating material 114. The volatile precursors 126 enter the chamber 122 and react and/or decompose on the electrical assembly 18 to produce the hydrophobic coating 26. The resistance heaters 122A-122C may be proximate to the electrical assemblies 18 to initiate the reaction and/or decomposition of the volatile precursors 126 and facilitate a uniform distribution of the hydrophobic coating material 114 at the electrical assemblies 18. In this manner, the hydrophobic coating 26 may also be formed having a sub-nanometer thickness.

The method 64 may also include attaching the enclosure 34 to the substrate 22 (operation 66D of FIG. 3). Attachment as depicted in FIG. 4J may be made using, for example, an adhesive (for example, epoxy) or cohesive substance, mechanical interface means, or thermal bonding. The attachment of the enclosure 34 to the mounting surface 48 of the substrate 22 may prevent the cooling fluid 30 from entering or exiting the chamber 36 of the enclosure 34, except through the inlet port 38A and/or outlet port 38B. The third semiconductor die 20C may be spaced from the enclosure 34 by a distance $D_3$ (FIG. 1A) which may be the same or substantially the same as the thickness $D_1$ of the interstitial spaces 74A-74C to facilitate flow of the cooling fluid 30 through the interstitial spaces 74A-74C (FIG. 4E). In this manner, the cooling fluid 30 may be precisely directed to the electrical assembly 18 for cooling the semiconductor dies 20A-20C.

Figure 4K:
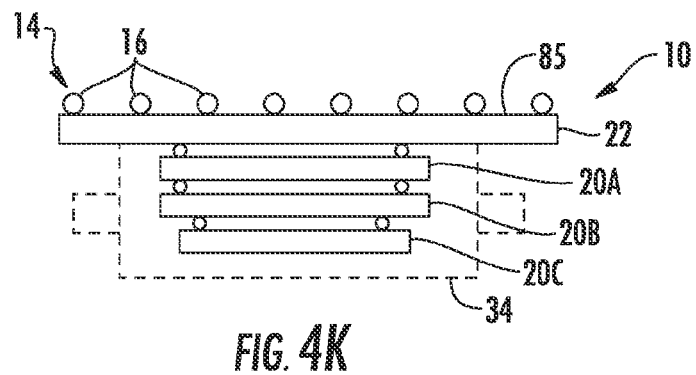
FIG. 4K is a side view of the second layer interconnect being conductively attached to the second surface of the substrate of the electrical assembly of FIG. 4J.

The method 64 may also include attaching the second layer interconnect 14 to the substrate 22 (operation 66E of FIG. 3). In this regard, the mask layer 75 may first be removed from the second surface 85 of the substrate 22. Removal, for example, may include a conventional processing solution to remove the mask layer 75 from the second surface 85. Once the mask layer 75 is removed, the second layer interconnect 14 may be attached. FIG. 4K is a side view of the second layer interconnect 14 being conductively attached to the second surface 85 of the substrate 22 of the electrical assembly 18. The second layer interconnect 14 may comprise the solder balls 16. The solder balls 16 may be precisely placed upon the second surface 85 of the substrate 22 using the ball placement system 72 discussed above. In this manner, the electrical device 10 may be created.

Figure 5A:
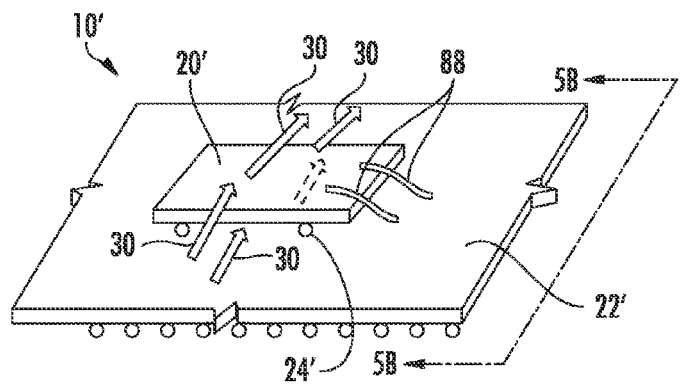
FIGS. 5A through 5C are a top perspective view, front side view, and left side view, respectively, of another example of an exemplary electrical device comprising a semiconductor die conductively connected to a substrate with electrical contact elements and/or wire bonds, while being cooled by a cooling fluid, wherein the electrical device may have a hydrophobic coating applied which prevents direct contact between the cooling fluid and the substrate, single die, electrical contact elements, and wire bonds.
Figure 5B:
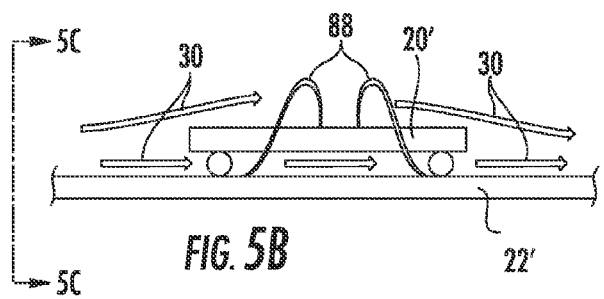
Figure 5C:
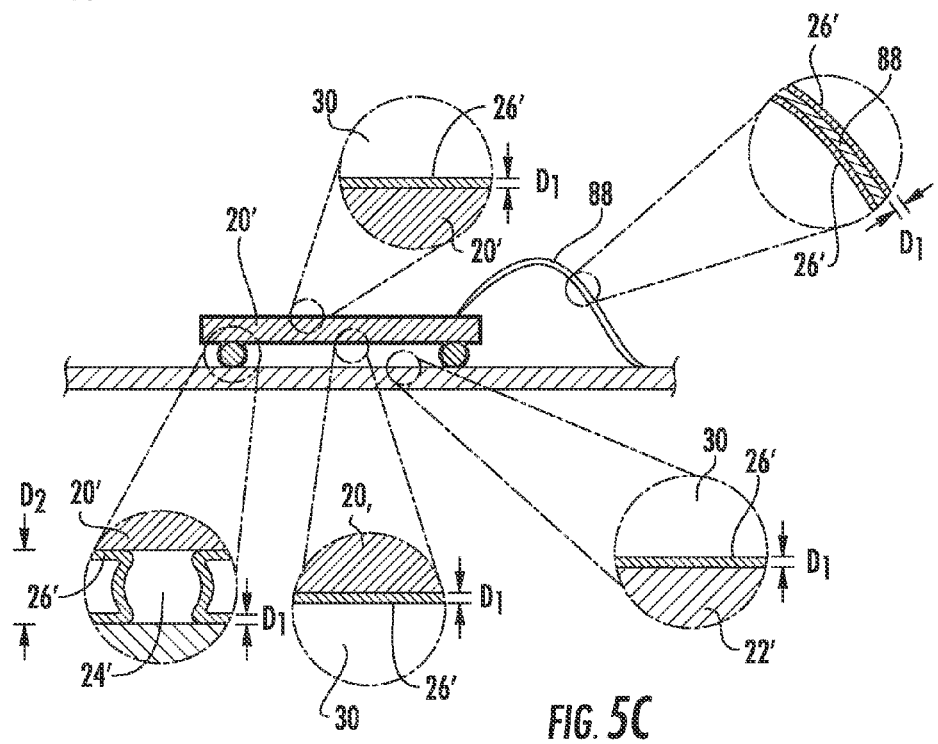

Although the electrical device 10 has been discussed above, other embodiments are possible. In this regard, FIGS. 5A through 5C are a top perspective view, front side view, and left side view, respectively, of another example of an exemplary electrical device 10' comprising a single semiconductor die 20' conductively connected to a substrate 22' with electrical contact elements 24', and wire bonds 88. The single semiconductor die 20' may be cooled by the cooling fluid 30 which flows past. The single semiconductor die 20', the electrical contact elements 24' and the wire bonds 88 may have a hydrophobic coating 26' applied which prevents direct contact between the cooling fluid 30 and the substrate 22', the single semiconductor die 20', the electrical contact elements 24', and the wire bonds 88. The hydrophobic coating 26' may have similar dimensions, chemical makeup, and manufacturing application processes as discussed above for electrical device 10. In this manner, the single semiconductor die 20' may be efficiently cooled.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An electrical assembly, comprising:
   at least one semiconductor die;
   a substrate configured to interface with an electrical source;
   at least one electrical contact element conductively connecting the at least one semiconductor die to the substrate; and
   a hydrophobic coating attached to the at least one semiconductor die, substrate, and at least one electrical contact element, wherein the hydrophobic coating is configured to form an effective contact angle with a water droplet of more than one-hundred fifty (150) degrees.

2. The electrical assembly of claim 1, wherein the hydrophobic coating configured to be applied using at least one of: dip coating, spin coating, spray coating, chemical vapor deposition, sputter coating, and evaporation deposition.

3. The electrical assembly of claim 1, wherein a thickness of the hydrophobic coating applied is in a range from two (2) angstroms to seventy-five (75) microns.

4. The electrical assembly of claim 1, wherein the hydrophobic coating comprising at least one of: organosilanes, silicones, and siloxanes.

5. The electrical assembly of claim 1, wherein the hydrophobic coating includes:
an inner surface of the hydrophobic coating in direct thermal conductive communication with the substrate, at least one semiconductor die, and the at least one electrical contact element; and
an outer surface configured for direct contact with a cooling fluid.

6. The electrical assembly of claim 5, wherein the at least one electrical contact element comprises at least one solder ball or wire bond.

7. The electrical assembly of claim 5, further comprising:
wherein a first semiconductor die is in a stacked arrangement with a second semiconductor die and a third semiconductor die to form a 3D chip stack; and further comprising:
the second semiconductor die and the third semiconductor die conductively coupled to the first semiconductor die and the substrate using through silicon vias (TSVs) and at least one electrical contact element; and
the hydrophobic coating attached to the second semiconductor die and the third semiconductor die.

8. The electrical assembly of claim 7, further comprising:
a first interstitial space adapted for passage of the cooling fluid between the first semiconductor die and the second semiconductor die, and
forming a second interstitial space between the second semiconductor die and the third semiconductor die, wherein the hydrophobic coating is arranged to entirely form at least one pathway for the cooling fluid through at least one of the first and the second interstitial spaces.

9. The electrical assembly of claim 5, wherein the hydrophobic coating is arranged to entirely form a pathway for the cooling fluid between the at least one semiconductor die and the substrate.

10. The electrical assembly of claim 1, further comprising an enclosure attached to the substrate, wherein the enclosure forms a chamber to contain the at least one die and the at least one electrical contact element, and the enclosure includes at least one inlet port for the cooling fluid to enter the chamber and at least one outlet port for the cooling fluid to exit the chamber.

11. The electrical assembly of claim 1, wherein the hydrophobic coating comprises sol-gel materials including metal oxides.

12. An electrical assembly, comprising:
at least one semiconductor die generating heat;
at least one substrate electrically coupled to an electrical source;
at least one electrical contact element conductively connecting the substrate and the at least one semiconductor die; and
a hydrophobic coating disposed on the at least one semiconductor die, at least one substrate, and at least one electrical contact element,
wherein the hydrophobic coating is configured to form an effective contact angle with a water droplet of more than one-hundred fifty (150) degrees, and
wherein the hydrophobic coating includes an inner surface in direct thermal conductive communication with the semiconductor die and an outer surface transferring heat through direct convective heat transfer to a cooling fluid.

13. The electrical assembly of claim 12, including:
the inner surface of the hydrophobic coating transferring heat to the outer surface across a thickness of the hydrophobic coating, wherein the thickness is in a range from two (2) angstroms to seventy-five (75) microns.

14. The electrical assembly of claim 12, wherein the hydrophobic coating comprises fluorinated organic compounds.

15. The electrical assembly of claim 12, further comprising the cooling fluid directed through a passageway entirely formed by the hydrophobic coating through a first interstitial space between the at least one semiconductor die and the substrate.

16. The electrical assembly of claim 15, wherein the first interstitial space includes a width in a range from one (1) micron to three (3) millimeters.

17. The electrical assembly of claim 12, including:
the cooling fluid directed through at least one inlet port of an enclosure into a chamber formed by the enclosure; and
the cooling fluid directed out of the chamber through at least one outlet port of the enclosure,
wherein the at least one semiconductor die and the at least one electrical contact element are disposed within the chamber.

18. The electrical assembly of claim 12, wherein the hydrophobic coating comprises diatomaceous earth.

19. An electrical assembly, comprising:
a substrate configured to interface with an electrical source;
a plurality of semiconductor die, including a first semiconductor die and a second semiconductor die, wherein the plurality of semiconductor die and the substrate are in a stacked arrangement to form a 3D chip stack, and the first semiconductor die is disposed between the second semiconductor die and the substrate, and;
at least one electrical contact element conductively connecting the first semiconductor die to the substrate and the second semiconductor die to at least one TSV (through silicon via) of the first semiconductor die;
a hydrophobic coating attached to each of the plurality of semiconductor die, substrate, and electrical contact element, wherein the hydrophobic coating is configured to form an effective contact angle with a water droplet of more than one-hundred fifty (150) degrees; and
an enclosure secured to the substrate and forming a chamber containing the plurality of semiconductor die, and the enclosure includes an inlet port and an outlet port configured for a cooling fluid to respectively enter and depart from the chamber,
wherein the hydrophobic coating includes an inner surface in direct conductive thermal communication with the semiconductor die and an outer surface arranged for direct convective thermal communication with the cooling fluid.

20. The electrical assembly of claim 19, wherein the substrate is a printed circuit board.

* * * * *